United States Patent
Booth et al.

(10) Patent No.: US 9,003,224 B2
(45) Date of Patent: Apr. 7, 2015

(54) MANAGING UNRELIABLE MEMORY IN DATA STORAGE SYSTEMS

(75) Inventors: Jing Booth, San Jose, CA (US);
Mei-Man L. Syu, Fremont, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 337 days.

(21) Appl. No.: 13/455,491

(22) Filed: Apr. 25, 2012

(65) Prior Publication Data

US 2013/0290793 A1 Oct. 31, 2013

(51) Int. Cl.
*G06F 11/07* (2006.01)
*G06F 11/10* (2006.01)
*G11C 29/00* (2006.01)

(52) U.S. Cl.
CPC ............ *G11C 29/82* (2013.01); *G06F 11/1048* (2013.01)

(58) Field of Classification Search
CPC .......................... G06F 11/0793; G06F 11/1068
USPC ........................................................ 714/6.13
See application file for complete search history.

(56) References Cited

U.S. PATENT DOCUMENTS

| | | | |
|---|---|---|---|
| 6,330,641 B1 * | 12/2001 | Yoshioka | 711/113 |
| 2007/0234101 A1 * | 10/2007 | Koktan et al. | 714/2 |
| 2008/0320585 A1 * | 12/2008 | Ansari et al. | 726/13 |
| 2009/0327590 A1 | 12/2009 | Moshayedi | |
| 2009/0327591 A1 | 12/2009 | Moshayedi | |
| 2010/0058109 A1 * | 3/2010 | Chang et al. | 714/8 |
| 2010/0064096 A1 * | 3/2010 | Weingarten et al. | 711/103 |
| 2010/0122113 A1 * | 5/2010 | Weingarten et al. | 714/5 |
| 2010/0174851 A1 | 7/2010 | Leibowitz et al. | |
| 2011/0038203 A1 * | 2/2011 | Camp et al. | 365/185.02 |
| 2011/0055623 A1 * | 3/2011 | Kim et al. | 714/5 |
| 2011/0138103 A1 * | 6/2011 | Iliadis et al. | 711/103 |
| 2012/0144249 A1 * | 6/2012 | Franceschini et al. | 714/54 |
| 2012/0236639 A1 * | 9/2012 | Camp et al. | 365/185.02 |

* cited by examiner

*Primary Examiner* — Chae Ko

(57) ABSTRACT

A data storage system configured to manage unreliable memory units is disclosed. In one embodiment, the data storage system maintains an unreliable memory unit list designating memory units in a non-volatile memory array as reliable or unreliable. The unreliable memory unit list facilitates management of unreliable memory at a granularity level finer than the granularity of a block of memory. The data storage system can add entries to the unreliable memory unit list as unreliable memory units are discovered. Further, the data storage system can continue to perform memory access operations directed to reliable memory units in blocks containing other memory units determined to be unreliable. As a result, the operational life of the data storage system is extended.

20 Claims, 6 Drawing Sheets

MANAGING UNRELIABLE MEMORY IN DATA STORAGE SYSTEMS

BACKGROUND

1. Technical Field

This disclosure relates to data storage systems, such as solid state drives, for computer systems. More particularly, the disclosure relates to managing unreliable memory units in data storage systems.

2. Description of the Related Art

Non-volatile memory arrays may contain defective locations, such as pages with uncorrectable error-correcting code (ECC) errors or correctable ECC errors with high raw bit errors. The defects may develop during manufacturing of the memory arrays or during usage of the memory arrays. For example, after a memory array has been subjected to a significant number of program-erase cycles (e.g., 30,000 cycles or more), pages of the memory array are more likely to experience or produce memory errors. If memory errors remain unaddressed, the memory errors can result in a loss of stored data. As a result, improved devices and methods for managing defective memory locations are desired.

BRIEF DESCRIPTION OF THE DRAWINGS

Systems and methods that embody the various features of the invention will now be described with reference to the following drawings, in which.

DETAILED DESCRIPTION OF SPECIFIC EMBODIMENTS

Figure 1:
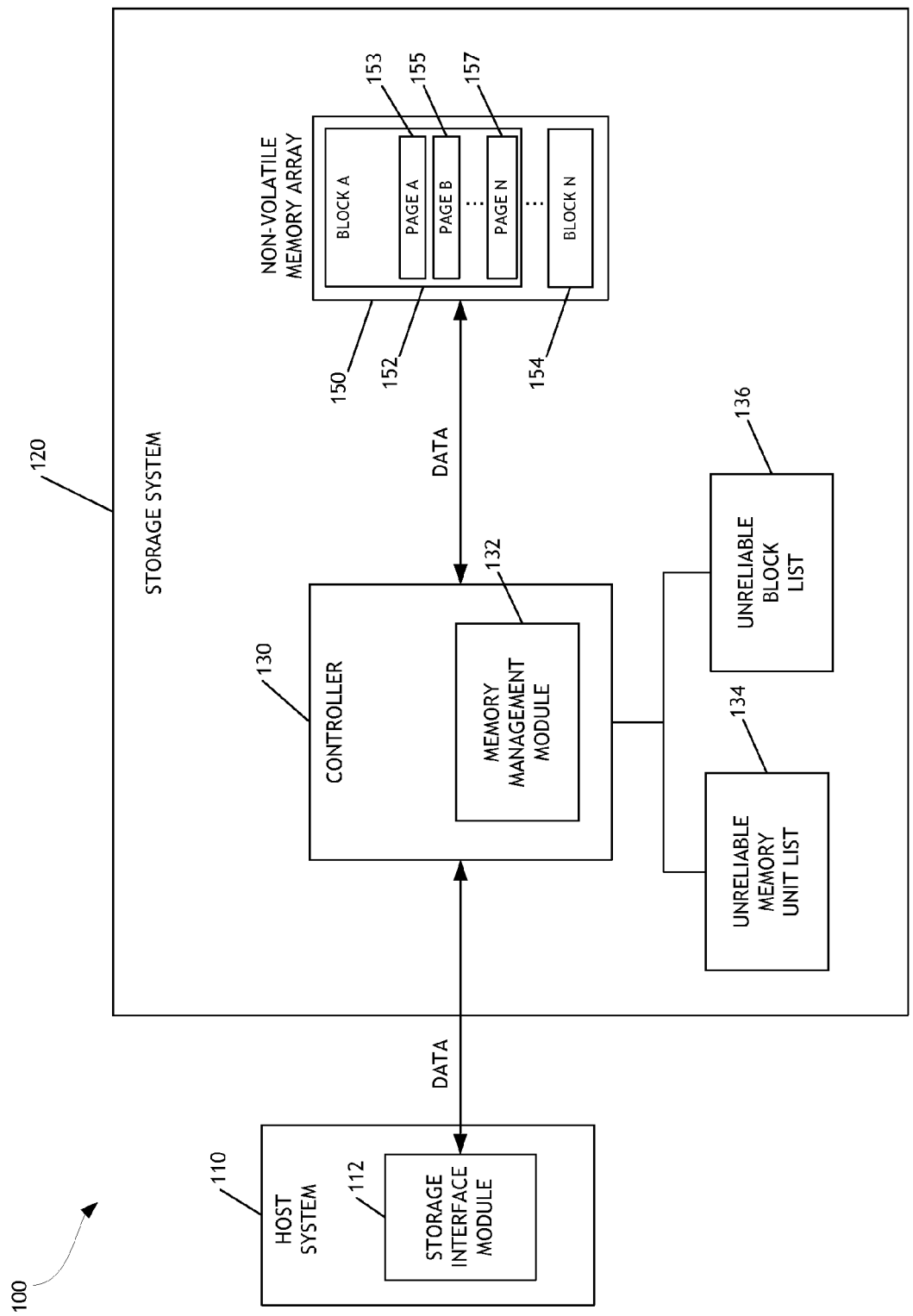
FIG. 1 illustrates a storage system that manages unreliable memory units according to one embodiment of the invention.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

In some data storage systems (e.g., solid-state storage systems), as pages of a block of memory become unreliable, the data storage system determines that such blocks should no longer be used for memory access operations. However, the blocks that are removed from active use contain significant numbers of reliable memory cells. Accordingly, data storage systems disclosed herein can track unreliable memory on a granularity finer than the granularity of a block, and thereby enable continued use of memory blocks that may be otherwise designated as unusable or unreliable. The overall effect is to extend the usable life of the storage device. For example, the life of some storage devices employing embodiments of the invention may extend beyond the manufacturer's warranted Program/Erase (PE) cycle counts. This may be particularly useful with the widespread use of Multi-Level Cell (MLC) NAND, which has a lower endurance (PE cycle count) than Single-Level Cell (SLC) NAND.

In some embodiments of the present invention, the data storage system manages unreliable memory units on a granularity of a plurality of pages, a page, or a partial page. The data storage system is configured to execute a memory access operation directed to a memory unit of the non-volatile memory array and detect a memory error that indicates a failure to execute the memory access operation. If a failure is detected in some embodiments, the data storage system adds an entry corresponding to the memory unit to an unreliable memory unit list, designating the memory unit as unreliable. Further, the data storage system can periodically flush the unreliable memory unit list from volatile memory to non-volatile memory.

In some embodiments, the data storage system determines a total number of memory units designated as unreliable in a block of memory. If the total number exceeds a selected threshold, the data storage system adds an entry corresponding to the block to an unreliable block list, designating the block as unreliable.

In some embodiments, the data storage system receives from a host system request to perform a program operation associated with a memory unit of a non-volatile memory array. In response, the data storage system selects a block of memory containing the memory unit and determines whether the memory unit and block are unreliable using an unreliable memory unit list and an unreliable block list. If the memory unit or block is determined to be unreliable, the data storage system can select another reliable memory unit and block combination for performing the program operation (e.g., storing data).

System Overview

FIG. 1 illustrates a storage system 120 that manages unreliable memory units according to one embodiment of the invention. As is shown, a storage system 120 (e.g., hybrid hard drive, solid state drive, etc.) includes a controller 130 and a non-volatile memory array 150, which comprises one or more blocks of storage, identified as Block "A" (152) through Block "N" (154). Each block comprises a plurality of pages. For example, Block A (152) of FIG. 1 includes a plurality of pages, identified as Pages A (153), B (155), through N (157). In some embodiments, each "block" is a smallest grouping of memory pages or locations of the non-volatile memory array 150 that are erasable in a single operation or as a unit, and each "page" is a smallest grouping of memory cells that can be programmed in a single operation or as a unit. (Other embodiments may use blocks and pages that are defined differently.) The term "memory unit" is used herein to refer to a set of memory locations, the set having fewer memory locations than a block of memory. For example, a memory unit can include plurality of pages, a page, or a partial page. However, in one embodiment, a memory unit can further refer to a set with greater number of memory locations than a block of memory, such as 1.50, 2.0, 2.25, etc., blocks of memory.

The controller 130 can be configured to receive data and/or storage access commands from a storage interface module 112 (e.g., a device driver) in a host system 110. Storage access commands communicated by the storage interface 112 can include write and read commands issued by the host system 110. Read and write commands can specify a logical block address in the storage system 120. The controller 130 can execute the received commands in the non-volatile memory array 150.

The controller 130 includes a memory management module 132. In one embodiment, the memory management module 132 manages unreliable memory of the non-volatile memory array 150 at a granularity level finer than the granularity of a block of memory, such as a granularity of plurality of pages, one page, or a partial page of memory (e.g., 4 KB, 8 KB, or 16 KB). In another embodiment, the memory management module 132 manages unreliable memory of the non-volatile memory array 150 at a granularity coarser than granularity of a block. To facilitate management of unreliable memory, the controller 130 and/or the memory management module 132 maintains an unreliable memory unit list 134, which includes a plurality of entries corresponding to memory units designated as reliable or unreliable. Further, the controller 130 and/or the memory management module 132 maintains an unreliable block list 136, which includes a plurality of entries corresponding to blocks designated as reliable or unreliable. Unreliable memory unit list 134 and unreliable block list 136 can be stored outside the controller 130 (as is depicted in FIG. 1), inside the controller 130, or partly inside and partly outside the controller 130.

The controller 130 and/or the memory management module 132 can flush the unreliable memory unit list 134 and unreliable block list 136 from volatile memory to non-volatile memory, such as the non-volatile memory array 150, to prevent loss of the unreliable memory unit list 134 and unreliable block list 136 if the volatile memory loses power. For example, the unreliable memory list 134 can be periodically flushed at particular intervals or in response to certain events, such as detection of unreliable power supply, discovery of an unreliable memory unit, discovery of a number of unreliable memory units, and the like. In one embodiment, the unreliable memory unit list 134 is flushed from one non-volatile memory to another non-volatile memory.

The non-volatile memory array 150 can be implemented using NAND flash memory devices. Other types of solid-state memory devices can alternatively be used, such as array of flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), Magnetoresistive RAM (MRAM), other discrete NVM (non-volatile memory) chips, or any combination thereof. In one embodiment, the non-volatile memory array 150 preferably includes multi-level cell (MLC) devices having multi-level cells capable of storing more than a single bit of information, although single-level cell (SLC) memory devices or a combination of SLC and MLC devices may be used. In one embodiment, the storage system 120 can include other memory modules, such as one or more magnetic memory modules.

The storage system 120 can store data received from the host system 110. That is, the storage system 120 can act as memory storage for the host system 110. To facilitate this function, the controller 130 can implement a logical interface. The logical interface can present to the host system 110 storage system memory as a set of logical addresses (e.g., contiguous address) where data can be stored. Internally, the controller 130 can map logical addresses to various physical memory addresses in the non-volatile memory array 150 and/or other memory module(s).

Management of Unreliable Memory

Figure 2:
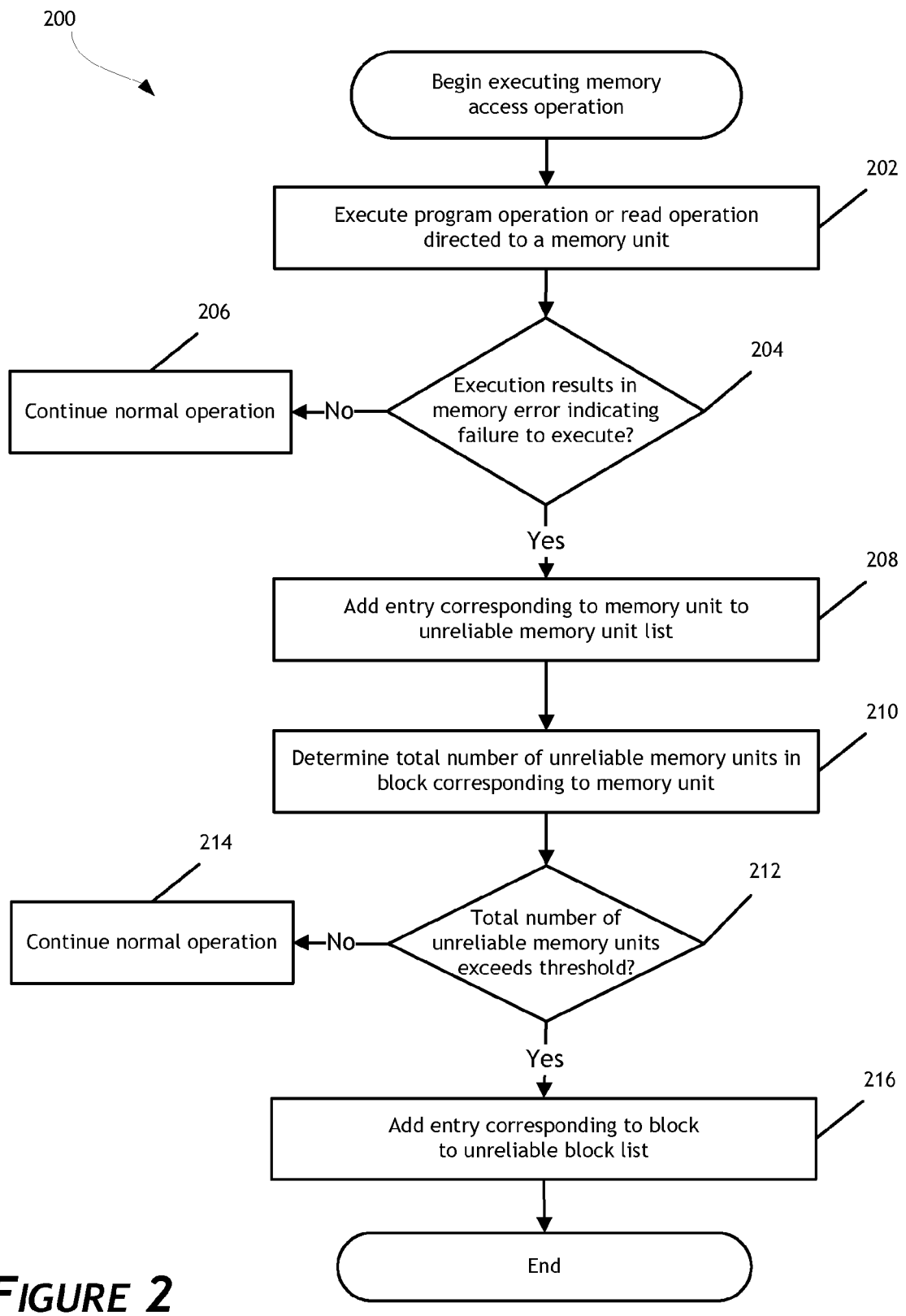
FIG. 2 is a flow diagram illustrating a process of managing unreliable memory units when executing a memory access operation according to one embodiment of the invention.

FIG. 2 is a flow diagram illustrating a process 200 of managing unreliable memory units when executing a memory access operation according to one embodiment of the invention. The process 200 can be executed by the controller 130 and/or the memory management module 132. Advantageously, the process 200 enables extending of the operational life of the data storage system 120. The process 200 allows memory access operations to be directed to some reliable memory units of a block of the non-volatile memory array 150 after it has been determined that the block includes unreliable memory units.

At block 202, the process 200 executes a memory access operation directed to a memory unit. The memory access operation can include a program operation or a read operation.

At block 204, the process 200 determines whether execution of the memory access operation results in a memory error that indicates a failure to execute. For instance, a memory error, such as an ECC error, read error, or program error, can be detected that indicates a failure to execute the memory access operation.

If execution does not result in a memory error that indicates a failure to execute, the process 200, at block 206, continues normal operation, such as by executing a next memory access operation.

Alternatively, if execution results in a memory error that indicates a failure to execute, the process 200, at block 208, adds an entry corresponding to the memory unit to an unreliable memory unit list 134. In one embodiment, the process 200 adds entries to an unreliable memory unit list 134 corresponding to the memory unit and other related memory units that may also have become unreliable. For example, experimentally it can be shown that some memory units likely become unreliable in pairs or groups, so if one memory unit becomes unreliable, entries corresponding to the other memory units in a pair or group can be added to the unreliable memory list 134. Further, the process 200 can also trigger a flushing of the unreliable memory unit list 134 from volatile to non-volatile memory.

The unreliable memory unit list 134 can include a plurality of entries corresponding to memory units designated as reliable or unreliable. Advantageously, the unreliable memory unit list 134 enables tracking of unreliable memory at a granularity level finer than a smallest granularity level at which the non-volatile memory array is erasable as a unit. For instance, the unreliable memory unit list 134 can correspond to a plurality of pages, a page, or a partial page of memory (e.g., 4 KB, 8 KB, or 16 KB). As another example, the unreliable memory unit list 134 can include entries corresponding to partial pages, where the size of the partial pages matches the granularity of an ECC process of the data storage system 120 (e.g., the ECC process granularity can be 2 KB while a page size can be 16 KB).

In one embodiment, the unreliable memory unit list 134 comprises a table. Each entry in the table corresponds to a memory unit of the non-volatile memory array 150 designated as reliable or unreliable. For example, the table can be stored a bitmap where each bit corresponds to a memory unit. If a value of 0 is stored, the corresponding memory unit can be designated as reliable. If a value of 1 is stored, the corresponding memory unit can be designated as unreliable. The designations of 0 and 1 bit values can be reversed in other cases. Advantageously, such a table design permits quick access of data from the unreliable memory unit list 134. The table can be compressed in some cases reduce the storage required to maintain the table.

In one embodiment, the unreliable memory unit list 134 contains entries corresponding to some memory units of the non-volatile memory array 150. The unreliable memory unit list 134 in this case can be stored as a series of linked lists where blocks containing unreliable memory units are included in the linked list. One example data structure according to an embodiment can include an 8 byte value encoding, as shown below.

| Byte 0 | Bytes 1-2 | Byte 3 | Bytes 4-7 |
|---|---|---|---|
| Channel No. Chip No. | Block No. | Memory Unit Offset | Bitmap for Unreliable Memory Units in Block |

The first byte (i.e., Byte 0) can store a channel number and chip number corresponding to a unreliable memory unit (e.g., Bits 0 to 3 can store the channel number, and Bits 4 to 7 can store the chip number). The next two bytes (i.e., Bytes 1-2) can store the block number corresponding to the unreliable memory unit. The following byte (i.e., Byte 3) can store a first unreliable memory unit or offset for the block (e.g., if a NAND block includes 256 pages, a value of 224 could represent the starting page number of 224 in the block). The final four bytes (i.e., Bytes 4-7) can store a bitmap for reliable or unreliable memory units in the block beginning with the first unreliable memory unit or offset (e.g., bitmap can include entries corresponding to reliable and unreliable pages for each page beginning with page 224 and ending with page 256). Advantageously, such a linked list design may utilize less storage than may be used to store a bitmap containing entries corresponding to all memory units of the non-volatile memory array 150. Further, in one embodiment, dedicated software or hardware may be used to access the unreliable memory unit list 134, such as the linked list, to increase the speed of each look-up in the linked list.

In some embodiments, other storage or search approaches can be utilized to store and/or search the unreliable memory unit list 134. For example, a hash look-up, balanced tree, or binary tree can be used. Furthermore, the unreliable memory unit list 134 can include entries corresponding only to either reliable memory units or unreliable memory units, rather than entries corresponding to reliable and unreliable memory units.

At block 210, the process 200 determines a total number of unreliable memory units in the block of memory corresponding to the memory unit. For instance, the process 200 can reference the unreliable memory unit list 134 and calculate a total number of memory units designated as unreliable within the block.

At block 212, the process 200 determines whether a total number of unreliable memory units exceed a threshold. The threshold can be based on an experimentally determined threshold where the access time for a remaining number of reliable memory units in a block do not justify continued use of the block. The threshold can be arbitrarily chosen in some cases based on a percentage of pages of a block that are determined unreliable (e.g., when 25%, 50% or 75% of the pages of a block are unreliable). Further, the threshold can vary from block to block depending on a rate of increase of the number of unreliable memory units in the block or neighboring blocks.

If the total number of unreliable memory units does not exceed the threshold, the process 200 moves to block 214. At block 214, the process 200 can continue normal operation, such as by executing the memory access operation at another memory unit that does not include an entry in the unreliable memory unit list 134 that designates the another memory unit as unreliable.

If the total number of unreliable memory units exceeds the threshold, the process 200 moves to block 216. At block 216, the process 200 adds an entry corresponding to the block of memory to an unreliable block list or bad block list 136. The unreliable block list 136 can include a plurality of entries corresponding to blocks that are designated as reliable or unreliable. Then, the process 200 can continue normal operation, such as by executing the memory access operation at another memory unit or block that do not have entries in an unreliable memory unit list 134 or an unreliable block list 136, designating the memory unit or block as unreliable.

Figure 3:
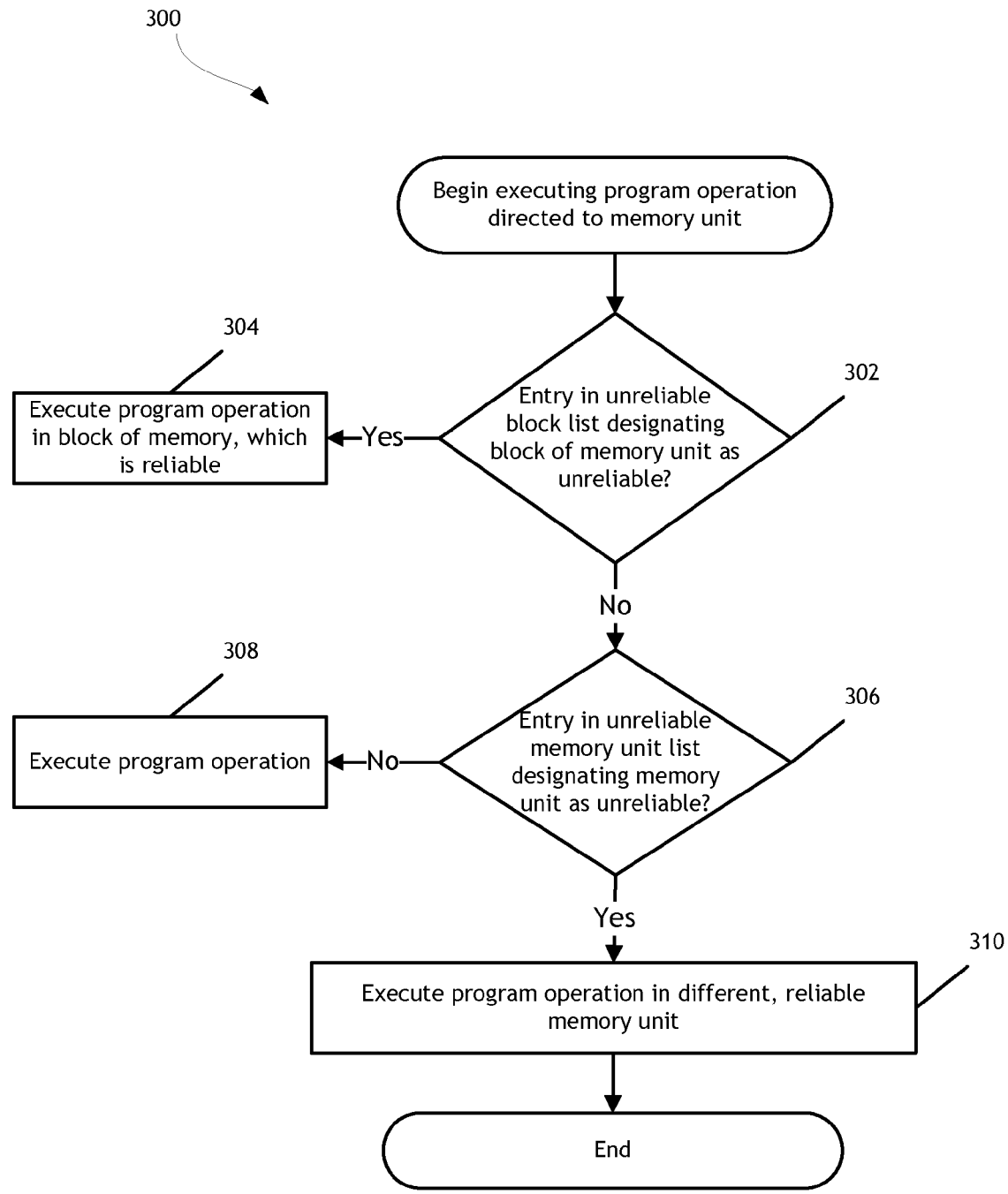
FIG. 3 is a flow diagram illustrating a process of managing unreliable memory units when executing a program operation according to one embodiment of the invention.

FIG. 3 is a flow diagram illustrating a process 300 of managing unreliable memory units when executing a program operation according to one embodiment of the invention. The program operation can be received from host system 110, and the program operation can be directed to or associated with a memory unit of a block of the non-volatile memory array 150, which is selected for programming. The process 300 can be executed by the controller 130 and/or the memory management module 132.

At block 302, the process 300 determines whether an unreliable block list 136 includes an entry designating the block of the memory unit as unreliable. If the unreliable block list 136 includes an entry designating the block as unreliable, the process 300 moves to block 304. At block 304, the process 300 executes the program operation in a different block of memory, which is reliable. For instance, the process 300 can select another memory unit from the different block in which to execute the program operation. To determine the reliability of the different block, the process 300 can restart at block 302 and determine whether an unreliable block list 136 includes an entry designating the different block as unreliable.

If the unreliable block list 136 does not include an entry designating the block as unreliable, the process 300 moves to block 306. At block 306, the process 300 determines whether an unreliable memory unit list 134 includes an entry designating the memory unit as unreliable.

If the unreliable memory unit list 134 includes an entry designating the memory unit as unreliable, the process 300 moves to block 308. At block 308, the process 300 executes the program operation in the memory unit.

On the other hand, if the unreliable memory unit list 134 does not include an entry designating the memory unit as unreliable, the process 300 moves to block 310. At block 310, the process 300 executes the program operation in a different, reliable memory unit. The different, reliable memory unit can include a memory unit of a block that does not have an entry in an unreliable memory unit list 134 or an unreliable block list 136 designating the memory unit or block as unreliable. In one embodiment, the process 300 can execute the program operation in a different, reliable memory unit in a same block and in place of the original memory unit. In another embodiment, the process 300 can execute the program operation in a different, reliable memory unit in a different block and in place of the original memory unit. Once the other memory unit or block of memory is selected, the process 300 can restart at block 302 and determine whether an unreliable block list 136 includes an entry designating the selected block as unreliable.

Figure 4:
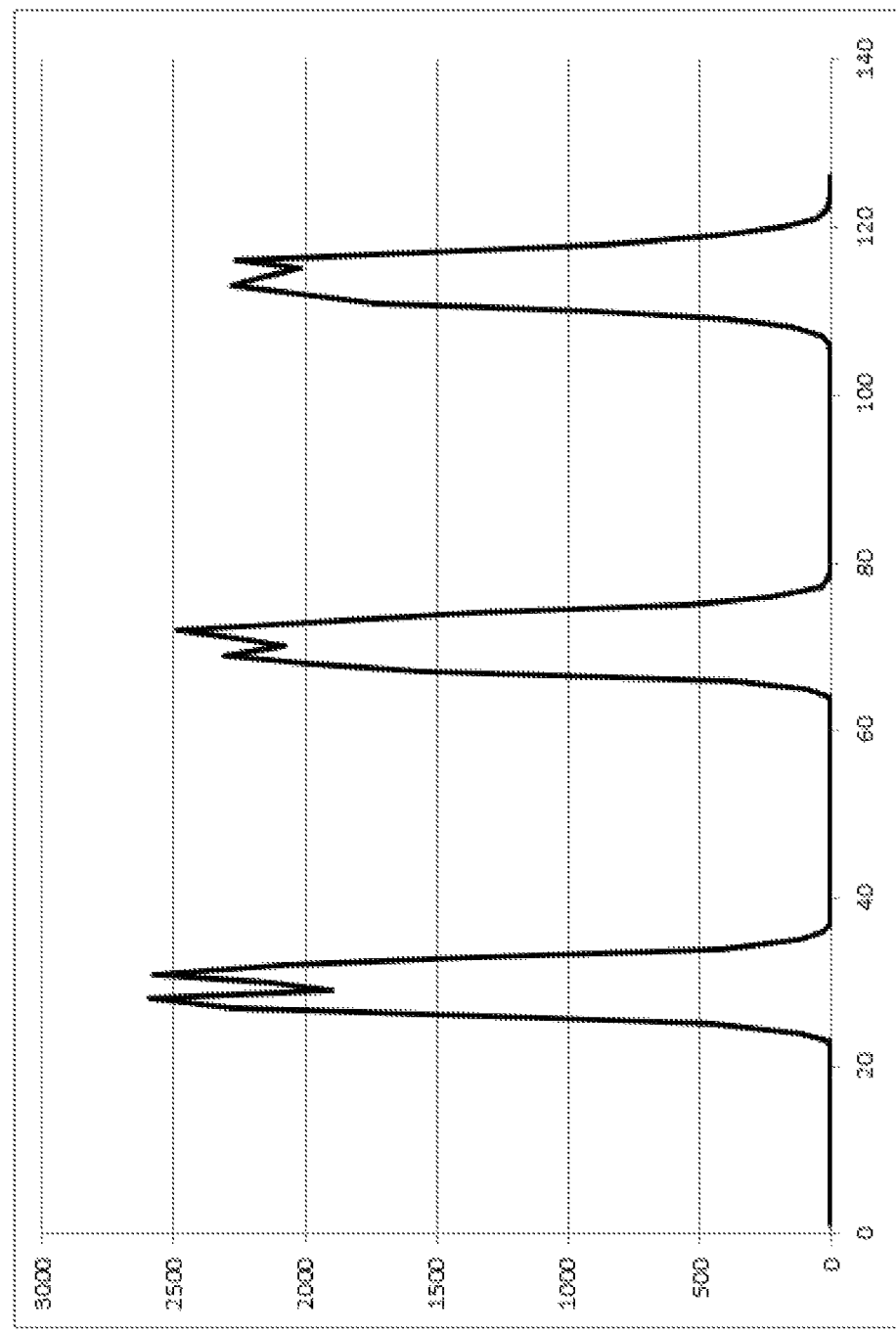
FIG. 4 is a graph illustrating the voltage threshold distribution of memory cells of a page at a given program-erase cycle level according to one embodiment of the invention.

FIG. 4 is a graph illustrating the voltage threshold distribution of memory cells of a page at a given program-erase cycle level according to one embodiment of the invention.

Graph 400 illustrates voltage threshold distribution of memory cells of a page at 1,000 program-erase cycle level in MLC NAND flash memory after random data patterns have been programmed. The x-axis is a voltage code axis corresponding to voltage level. The y-axis corresponds to a probability distribution of cells in the page. As can be seen in the graph, the voltage threshold distribution of cells form relatively defined, narrow, and separated peaks at three approximate voltage reference levels, suggesting a generally higher quality and level of reliability or endurance of the page.

Figure 5:
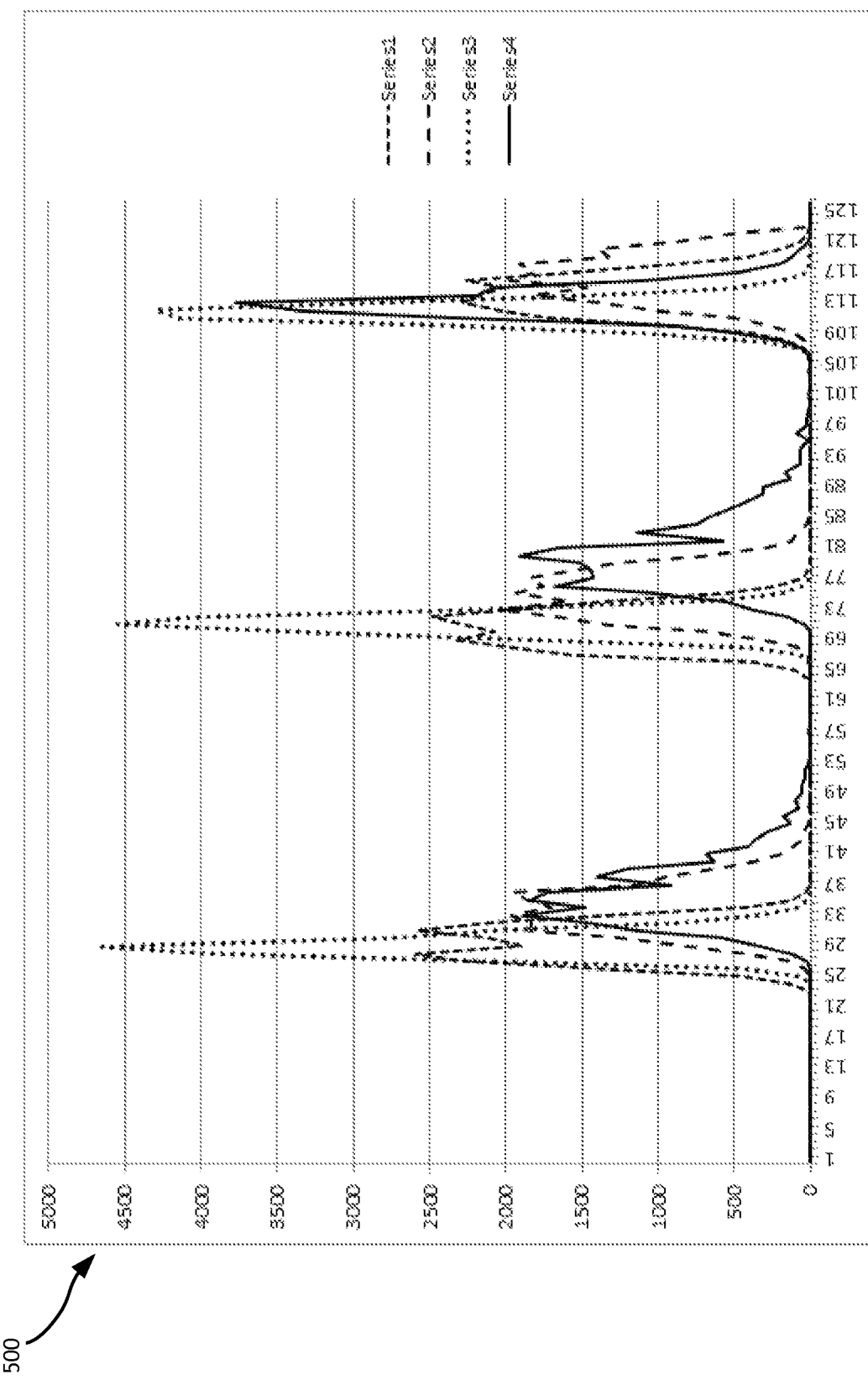
FIG. 5 is a graph illustrating the voltage threshold distribution of memory cells of two pages of a block at two different program-erase cycle levels according to one embodiment of the invention.

FIG. 5 is a graph illustrating the voltage threshold distribution of memory cells of two pages of an example block at two different program-erase cycle levels according to one embodiment of the invention. Graph 500 illustrates voltage threshold distribution of memory cells of two pages in MLC NAND flash memory after random data patterns have been programmed. The x-axis is a voltage code axis corresponding to voltage level. The y-axis corresponds to a probability distribution of cells in the page. Series 1 and 3 illustrate Page 0 of the block at the 1,000 and 30,000 program-erase cycle levels, respectively. Series 2 and 4 illustrate Page 250 of the block at the 1,000 and 30,000 program-erase cycle levels, respectively. In one embodiment, same random data patterns have been written to Pages 0 and 250. In another embodiment, different random data patterns have been written to Pages 0 and 250.

As can be seen from Series 1 and 2, the voltage threshold distribution of cells for Pages 0 and 250 form relatively defined, narrow, and separated peaks at three approximate voltage reference levels at the 1,000 program-erase cycle level. This indicates a generally higher quality and level of reliability or endurance for the Pages 0 and 250 since these voltage threshold levels allow for further adjustment to when retrieving data, among other reasons. However, as can be seen from Series 3 and 4, the peaks of the voltage threshold distributions of Pages 0 and 250 widen and shorten at the 30,000 program-erase cycle level, indicating a generally diminishing quality and level of reliability or endurance of the cells. In particular, the peaks of Series 4 shows greater widening and shortening than the peaks of Series 3, which indicates that Page 250 demonstrates a lower quality and level of reliability or endurance than Page 0. Accordingly, some pages may be advantageously be included in an unreliable memory unit list 134 before other pages since some pages may demonstrate a lower quality and level of reliability or endurance than others. For instance, pages located physically nearer to the end of a block may demonstrate a lower quality and level of reliability or endurance than other pages of the same block, as illustrated by FIG. 5. As discussed above, the unreliable memory list 134 enables pages with higher quality to continue be used even though they may be located in a block with pages of lower quality that can no longer be reliably used.

Figure 6:
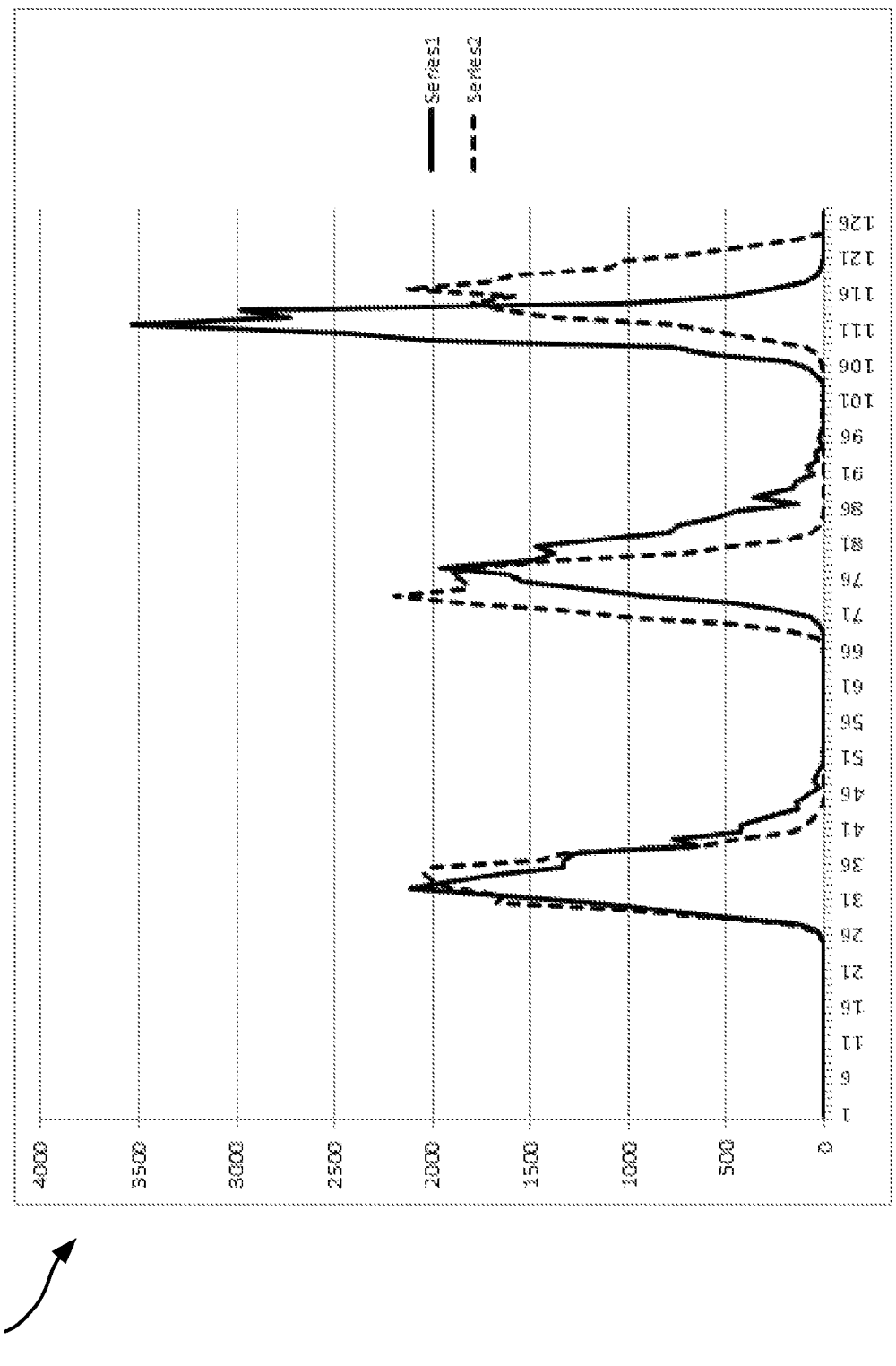
FIG. 6 is a graph illustrating the voltage threshold distribution of memory cells of two pages of a block at a given program-erase cycle level according to one embodiment of the invention.

FIG. 6 is a graph illustrating the voltage threshold distribution of memory cells of two pages of a block at a given program-erase cycle levels according to one embodiment of the invention. Graph 600 illustrates voltage threshold distribution of memory cells of two pages in MLC NAND flash memory after random data patterns have been programmed. The x-axis is a voltage code axis corresponding to voltage level. The y-axis corresponds to a probability distribution of cells in the page. Series 1 illustrates Page 4 of the block at the 30,000 program-erase cycle level. Series 2 illustrates Page 254 of the block at the 30,000 program-erase cycle level. In one embodiment, same random data patterns have been written to Pages 4 and 254. In another embodiment, different random data patterns have been written to Pages 4 and 254.

As can be seen from Series 1 and 2, the peaks of Series 2 show greater widening and shortening than the peaks of Series 1, which indicates that Page 254 demonstrates a lower quality and level of reliability or endurance than Page 4. Accordingly, some pages may be advantageously be included in an unreliable memory unit list 134 before other pages since some pages may demonstrate a lower quality and level of reliability or endurance than other pages. For instance, pages located physically nearer to the end of a block may demonstrate a lower quality and level of reliability or endurance than other pages of the same block, as illustrated by FIG. 6.

Other Variations

Those skilled in the art will appreciate that in some embodiments, other approaches and methods can be used to store and manage an unreliable memory unit list 134 for the non-volatile memory array 150. Further, events other than exceeding a threshold number of unreliable memory units can be used to determine when to include a block in an unreliable block list 136. For instance, a block may be included after an erase error or an unusually large number of determined unreliable memory units in the block within a particular time. Additional system components can also be utilized, and disclosed system components can be combined or omitted. For example, the host system 110 can be configured to store a copy of the unreliable memory unit list 134 or cause flushing of an unreliable memory unit list 134 from volatile memory to non-volatile memory. In addition, the actual steps taken in the disclosed processes, such as the process illustrated in FIGS. 2 and 3, may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system comprising:
a non-volatile memory array; and
a controller configured to:

execute a memory access operation directed to a memory unit of the non-volatile memory array, the memory unit having fewer memory locations than a block of memory, wherein the block of memory is a smallest number of memory locations that is erasable as a unit;

detect a memory error that indicates a failure to execute the memory access operation;

in response to detecting the memory error that indicates the failure to execute the memory access operation:

add an entry corresponding to the memory unit to an unreliable memory unit list, the unreliable memory unit list comprising a plurality of entries corresponding to memory units of the non-volatile memory array designated as unreliable, whereby unreliable memory is tracked at a granularity level finer than a smallest granularity level at which the non-volatile memory array is erasable; and in response to determining that a total number of unreliable memory units in a first memory block containing the memory unit exceeds a first threshold:

add an entry corresponding to the first memory block to an unreliable memory block list thereby preventing execution of subsequent memory access operations in the first memory block, wherein the first threshold differs from a second threshold used by the controller to determine whether to add an entry corresponding to a second memory block of the non-volatile memory array to the unreliable memory block list, and wherein the operational life of the data storage system is extended by allowing for memory access operations to be directed to some reliable memory units of the first memory block after it has been determined that the first memory block comprises one or more unreliable memory units.

2. The data storage system of claim 1, wherein the block of memory comprises a plurality of pages, and each entry in the unreliable memory unit list corresponds to a plurality of pages of memory, a page of memory, or a partial page of memory.

3. The data storage system of claim 2, wherein each entry in the unreliable memory unit list corresponds to the partial page of memory, and the size of the partial page of memory matches a granularity of an error correction code process.

4. The data storage system of claim 1, wherein the unreliable memory unit list comprises a table, and each entry in the table corresponds to a memory unit designated as reliable or unreliable.

5. The data storage system of claim 1, wherein the unreliable memory unit list comprises a list, and each entry in the list corresponds to a memory unit designated as reliable or unreliable.

6. The data storage system of claim 1, wherein the memory access operation comprises a program operation or a read operation.

7. The data storage system of claim 1, wherein the controller is further configured to determine the first threshold based at least on one or more of (1) a rate of increase of the total number of unreliable memory units in the first memory block and (2) a rate of increase of a total number of unreliable memory units in one or more memory blocks that neighbor the first memory block.

8. The data storage system of claim 1, wherein the controller is further configured to:

store the unreliable memory unit list in volatile memory; and periodically flush the unreliable memory unit list from the volatile memory to the non-volatile memory array.

9. In a data storage system comprising a controller and a non-volatile memory array, a method of managing unreliable memory units, the method comprising:

executing a memory access operation directed to a memory unit of the non-volatile memory array, the memory unit having fewer memory locations than a block of memory, wherein the block of memory is a smallest number of memory locations that is erasable as a unit;

detecting a memory error that indicates a failure to execute the memory access operation;

in response to detecting the memory error that indicates the failure to execute the memory access operation:

adding an entry corresponding to the memory unit to an unreliable memory unit list, the unreliable memory unit list comprising a plurality of entries corresponding to memory units of the non-volatile memory array designated as unreliable, whereby unreliable memory is tracked at a granularity level finer than a smallest granularity level at which the non-volatile memory array is erasable; and in response to determining that a total number of unreliable memory units in a first memory block containing the memory unit exceeds a first threshold:

adding an entry corresponding to the first memory block to an unreliable memory block list thereby preventing execution of subsequent memory access operations in the first memory block, wherein the first threshold differs from a second threshold used to determine whether to add an entry corresponding to a second memory block of the non-volatile memory array to the unreliable memory block list.

10. The method of claim 9, wherein the block of memory comprises a plurality of pages, and each entry in the unreliable memory unit list corresponds to a plurality of pages of memory, a page of memory, or a partial page of memory.

11. The method of claim 10, wherein each entry in the unreliable memory unit list corresponds to the partial page of memory, and the size of the partial page of memory matches a granularity of an error correction code process.

12. The method of claim 9, wherein the unreliable memory unit list comprises a table, and each entry in the table corresponds to a memory unit designated as reliable or unreliable.

13. The method of claim 9, wherein the unreliable memory unit list comprises a list, and each entry in the list corresponds to a memory unit designated as reliable or unreliable.

14. The method of claim 9, wherein the memory access operation comprises a program operation or a read operation.

15. The method of claim 9, further comprising determining the first threshold based at least on one or more of (1) a rate of increase of the total number of unreliable memory units in the first memory block and (2) a rate of increase of a total number of unreliable memory units in one or more memory blocks that neighbor the first memory block.

16. The method of claim 9, wherein the unreliable memory unit list is stored in volatile memory and periodically flushed from the volatile memory to the non-volatile memory array.

17. In a data storage system comprising a controller and a non-volatile memory array, a method of storing data, the method comprising:

receiving a program operation, the program operation associated with a first memory unit of the non-volatile memory array and data to be programmed, wherein the first memory unit has fewer memory locations than a smallest number of memory locations that is erasable as a unit;

selecting, for programming, a first block of memory containing the first memory unit when a total number of unreliable memory units in the first block of memory does not exceed a first threshold different from a second threshold;

determining whether an unreliable memory unit list comprises an entry indicating that the first memory unit is unreliable; and in response to determining that the unreliable memory unit list comprises the entry:

selecting, from the first block of memory, a second memory unit that has no associated entry in the unreliable memory unit list; and storing the data in the second memory unit, wherein the total number of unreliable memory units in the first block of memory not exceeding the first threshold permits execution of memory access operations in the first block of memory, wherein the second threshold is used to determine whether to add an entry corresponding to a second block of memory of the non-volatile memory array to an unreliable memory block list, and wherein the method is performed under the control of the controller.

18. The method of claim 17, further comprising, prior to determining whether the unreliable memory unit list comprises the entry indicating that the first memory unit is unreliable:

determining whether the unreliable memory block list comprises an entry indicating that the first block of memory is unreliable; and in response to determining that the unreliable memory block list comprises the entry indicating that the first block of memory is unreliable:

selecting a third block of memory of the non-volatile memory array that has no associated entry in the unreliable memory block list; and using a third memory unit from the third block of memory in place of the first memory unit.

19. A data storage system comprising:
a non-volatile memory array; and
a controller configured to:

receive a program operation, the program operation associated with a first memory unit of the non-volatile memory array and data to be programmed, wherein the first memory unit has fewer memory locations than a smallest number of memory locations that is erasable as a unit;

select, for programming, a first block of memory containing the first memory unit when a total number of unreliable memory units in the first block of memory does not exceed a first threshold different from a second threshold;

determine whether an unreliable memory unit list comprises an entry indicating that the first memory unit is unreliable; and in response to determining that the unreliable memory unit list comprises the entry:

select, from the first block of memory, a second memory unit that has no associated entry in the unreliable memory unit list; and store the data in the second memory unit wherein the total number of unreliable memory units in the first block of memory not exceeding the first threshold permits execution of memory access operations by the controller in the first block of memory, wherein the second threshold is used by the controller to determine whether to add an entry corresponding to a second block of memory of the non-volatile memory array to an unreliable memory block list.

20. The data storage system of claim 19, wherein the controller is further configured to:

determine whether the unreliable memory block list comprises an entry indicating that the first block of memory is unreliable; and in response to determining that the unreliable memory block list comprises the entry indicating that the first block of memory is unreliable:

select a third block of memory of the non-volatile memory array that has no associated entry in the unreliable memory block list; and use a third memory unit from the third block of memory in place of the first memory unit.

* * * * *